United States Patent [19]

Van Berkel et al.

[11] Patent Number: 5,280,596
[45] Date of Patent: Jan. 18, 1994

[54] WRITE-ACKNOWLEDGE CIRCUIT INCLUDING A WRITE DETECTOR AND A BISTABLE ELEMENT FOR FOUR-PHASE HANDSHAKE SIGNALLING

[75] Inventors: Cornelis H. Van Berkel; Ronald W. J. J. Saeijs, both of Eindhoven, Netherlands

[73] Assignee: U.S. Philips Corporation, New York, N.Y.

[21] Appl. No.: 659,805

[22] Filed: Feb. 21, 1991

[30] Foreign Application Priority Data

Mar. 9, 1990 [NL] Netherlands ............ 9000544

[51] Int. Cl.⁵ ............ G06F 13/42; H03K 17/687; H03K 3/356
[52] U.S. Cl. ............ 395/425; 395/550; 395/325; 365/233; 307/272.1; 307/279; 307/571; 307/584; 307/247.1
[58] Field of Search ............ 395/425, 325, 550; 365/233; 307/443, 481, 272.1, 247.1, 292, 279, 248, 571, 584

[56] References Cited

U.S. PATENT DOCUMENTS

| | | | |
|---|---|---|---|
| 3,812,388 | 5/1974 | Southworth | 307/247.1 |
| 4,390,969 | 6/1983 | Hayes | 395/550 |
| 4,534,011 | 8/1985 | Andrews et al. | 395/250 |
| 4,563,599 | 1/1986 | Donoghue et al. | 307/448 |
| 4,598,216 | 7/1986 | Lauffer et al. | 307/481 |
| 4,692,635 | 9/1987 | Rapp | 307/481 |
| 4,751,683 | 6/1988 | Wada et al. | 365/233 |
| 4,791,614 | 12/1988 | Arakawa | 365/228 |
| 4,937,792 | 6/1990 | Suzuki et al. | 365/233.5 |
| 4,982,117 | 1/1991 | Matsuzaki et al. | 307/480 |
| 5,005,136 | 4/1991 | Van Berkel et al. | 364/490 |
| 5,070,443 | 12/1991 | Priem et al. | 395/725 |

OTHER PUBLICATIONS

Sood et al., "A Fast 8K×8 CMOS SRAM With Internal Power Down Design Techniques," IEEE Journal of Solid State Circuits, vol. SC-20, No. 5, Oct. 1985, pp. 941-945.

"Static RAM Input Buffer and Its Transition Detector," IBM Tech. Disc. Bull., vol. 27, No. 10B, Mar. 1985, pp. 6189-6191.

*Primary Examiner*—Glenn Gosssage
*Attorney, Agent, or Firm*—Leroy Eason

[57] ABSTRACT

A write-acknowledge circuit includes a write detector and a bistable element. The write detector has two write inputs, two complementary inputs and an acknowledge output, and is constituted by only two transistors which are connected in series. The complementary inputs are the control inputs of the two transistors and the acknowledge output is output from their common connection point. The write inputs are respectively coupled to the two remaining terminals of the two transistors and also to the two respective inputs of the bistable element. The complementary inputs are coupled crosswise to the outputs of the bistable element. The write signals represent a 1-bit variable encoded according to the Double-Rail Encoding method. Four-phase handshake signalling is used for the write signals. The acknowledge output is activated by the complementary inputs to the write detector in response to a write signal on either of the two write inputs, the acknowledge signal denoting that the write signal has been processed by the write-acknowledge circuit and so can be permitted to return to a rest value.

5 Claims, 2 Drawing Sheets

WRITE-ACKNOWLEDGE CIRCUIT INCLUDING A WRITE DETECTOR AND A BISTABLE ELEMENT FOR FOUR-PHASE HANDSHAKE SIGNALLING

BACKGROUND OF THE INVENTION

1. Field of the Invention

The invention relates to a write-acknowledge circuit comprising a write detector having two write inputs, two complementary inputs and an acknowledge output, and further comprising a bistable element having two inputs coupled to the respective write inputs of the write detector and having two outputs coupled crosswise to the respective complementary inputs of the write detector for supplying two complementary signals thereto in response to a write signal on one of the two write inputs.

2. Description of the Related Art

A write-acknowledge circuit of this type is known from FIG. 15 of published European Patent Specification No. 0 329 233, which corresponds to U.S. application Ser. No. 156,392, filed Feb. 16, 1988, now U.S. Pat. No. 5,005,136, issued Apr. 2, 1991, assigned to the present assignee. The Boolean value of a single variable is applied to both write inputs of the write-acknowledge circuit: to one write input the value "TRUE" and to the other write input the value "FALSE" is applied. This is also termed Double-Rail Encoding.

Producing an acknowledge signal in response to a write signal on a write input renders this write-acknowledge circuit extremely suitable for use in delay-insensitive circuits which operate at any combination of delays of individual gates and connections. In delay-insensitive circuits, communication takes place by means of changes in the signal values on the wires between the inputs and outputs (for example, the write inputs and acknowledge output of the write-acknowledge circuit). The delay-insensitivity is caused by the fixed-causality relations between the signal changes.

The disadvantage of Double-Rail Encoding is that two wires instead of one are necessary for transmitting the two possible signal values of a 1-bit variable. The use of two wires, however, is advantageous in that is provides an implicit reference; that is to say, the voltage on one wire is high relative to the voltage on the other wire and so the signal value of the variable is determined unambiguously. When using one wire there is no reference point and, consequently, voltage variations on the wire may affect the signal value of the variable. Voltage variations may, of course, also occur with Double-Rail Encoding, but since they then occur on the two wires at the same time, such voltage variations have little or no impact on the implicit reference value of the voltage between the two wires.

In the case of Double-Rail Encoding, the write-acknowledge circuit operation is independent of the clock frequency, as a result of which it is possible for the circuit to operate at a higher speed than if the circuit were actually dependent on the clock rate. It is true that the use of two wires does cost space. However, the circuits, components and wires necessary for driving with a clock are then no longer necessary. Thus, on the whole there may be a space saving effect.

Depending on which write input has the logic value "1", the variable has the Boolean value TRUE or FALSE. During a state of rest, the write signals on the write inputs have the same logic value (for example, "0"). When either one of the two write signals changes from the rest value "0" to the inverted logic value "1", the acknowledge signal on the acknowledge output will also change form "0" to "1". The acknowledge signal denotes that the write signal has been processed by the circuit and so the write signal may again assume the rest value. The acknowledge signal further denotes that a change has occurred in one of the write signals, but gives no information on the write input concerned. Subsequently, the state of rest is reverted to, resulting in that the acknowledge signal also returning to the original "0" logic value.

The above-described procedure is valid for the two write signals and is termed four-phase handshake signalling.

the write detector in the prior-art write-acknowledge circuit requires ten transistors. An object of the present invention is to provide a write detector comprising fewer transistors.

SUMMARY OF THE INVENTION

The write-acknowledge circuit according to the invention is characterized in that the write detector comprises a series connection of two switch elements each having a first terminal, a second terminal and a control input. The terminals form the two write inputs of the write detector, the second terminals are interconnected and collectively form the acknowledge output, and the control inputs form the two complementary inputs of the write detector.

The invention is based on the fact that the write signals never simultaneously have the inverted logic value relative to the rest value, and also on the fact that since the output signals of the bistable element are complementary the switch elements of the write detector are never simultaneously rendered conductive. Each switch element can be; for example, a transistor.

An embodiment of the write-acknowledge circuit according to the invention is characterized in that each switch element comprises either an n-channel metal oxide semiconductor (n-MOS) transistor have a control input which forms the control input of the switch element, or a p-channel metal oxide semiconductor (p-MOS) transistor with an inverter, the inverter input being the control input of the switch element and the inverter output being connected to the control input of the p-MOS transistor. The bistable element comprises two NOR gates each having two inputs and a single output which form the inputs and the outputs of the bistable element.

When the write-acknowledge circuit changes from the state of rest to a different state, the output signals of the bistable element may simultaneously have the same logic value, i.e. "0", during this brief transition period. Due to this logic value "0" the two transistors will not be conductive and so direct current will not begin to flow. Therefore, there is no chance of the circuit being damaged.

AN embodiment of the write-acknowledge circuit may also be characterized in that each switch element comprises either a p-MOS transistor having a control input which forms the control input of the switch element or comprises an n-MOS transistor with an inverter, the inverter input forming the control input of the switch element and the inverter output being connected to a control input of the n-MOS transistor. The bistable element comprises two NAND gates having each two inputs and an output which form the inputs and the outputs of the bistable element. In this embodiment, the output signals of the bistable element may simultaneously have the logic value "1" during the transition period, but no direct current will flow since two transistors will not be conductive.

The write-acknowledge circuit according to the invention is advantageous the circuit requires less space and in that the transmission of the signals is faster than by the prior-art circuit.

BRIEF DESCRIPTION OF THE DRAWINGS

The invention and its advantages will now be further explained with reference to the appended drawings, in which.

DESCRIPTION OF THE PREFERRED EMBODIMENTS

Figure 1:
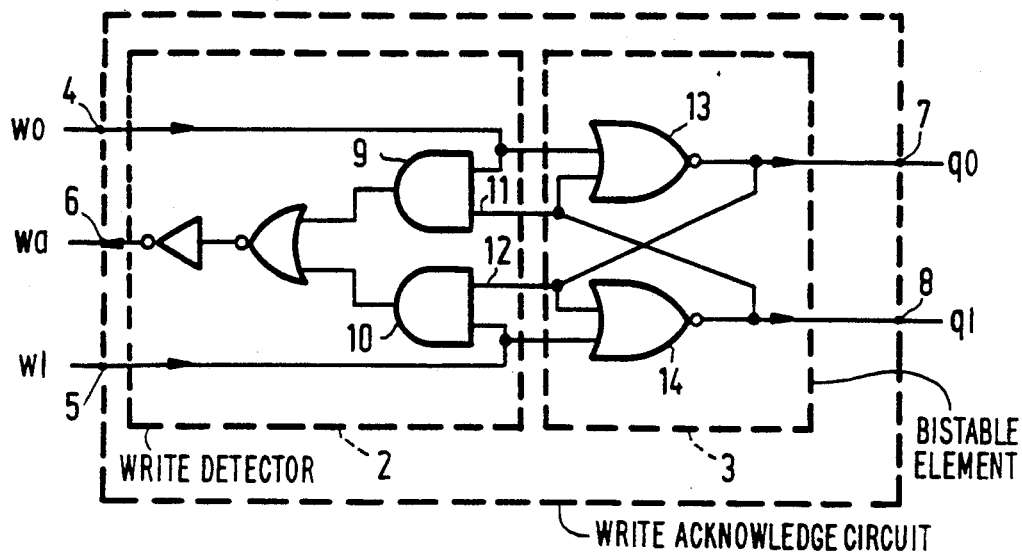
FIG. 1 is a logic diagram of a prior art form of a write-acknowledge circuit comprising a write detector and a bistable element.

FIG. 1 shows a logic diagram of a prior art write-acknowledge circuit 1. It comprises a write detector 2 and a bistable element 3 connected to one another. The write detector 2 has two write inputs 4 and 5, two complementary inputs 11 and 12 and an acknowledge output 6. The write detector 2 comprises two AND gates 9 and 10 connected to the acknowledge output 6 by means of a NOR gate and an inverter. The AND gates 9 and 10 each have two inputs that form the write inputs 4, 5 and the complementary inputs 11, 12 of the write detector 2.

The bistable element 3 has two NOR gates 13 and 14 which each have a first and a second input and an output, the outputs thereof being designated 7 and 8 respectively. The outputs 7 and 8 are connected crosswise (or crosscoupled) to the respective second inputs of NOR gates 14 and also to 13 and the respective complementary inputs 12 and 11 of AND gates 10 and 9. The write inputs 4 and 5 are connected to the first inputs of NOR gates 13 and 14 respectively.

The write-acknowledge circuit 1 is suitable for four-phase handshake signalling. The relationship between the write signals w0, w1 on the respective write inputs 4 and 5 and signal wa on acknowledge output 6 is given by the following expression, wherein q0 and q1 are the respective output signals on outputs 7 and 8.

{([w0];q0↓, q1↑; [Eq0 o q1]; wa↓; [Ew0];
wa↑)|([w1]; q0↓, q1↑; [q0 o Eq1]; wa↓; [Ew1];
wa↑)}*

The following logic values will be assumed for the initial state of the write-acknowledge circuit 1:

w0:=FALSE, w1:=FALSE, wa:=FALSE, (q0 o Eq1)+Eq0 q1).

In the previous and subsequent expressions "FALSE" is associated with a low voltage and "TRUE" with a high voltage. Furthermore, for these expressions the following will hold:

| a | stands for | the inverted value for variable a |
|---|---|---|
| a↓ | | variable assumes the logic value "FALSE"; |
| a↑ | | variable assumes the logic value "TRUE" |
| [e] | | wait until the Boolean expression e is "TRUE"; |
| S* | | carry out S for an unlimited number of times; |
| S\|T | | carry out either S or T; |
| S;T | | first carry out S then T; |
| a,b | | carry out elementary orders a and b in any order or in parallel; |
| o | | AND function; |
| + | | OR function. |

The write signals w0 and w1 encode a 1-bit variable with this four-phase handshake signalling where, for example, w0 denotes whether the variable has the value "TRUE" and w1 denotes whether the variable has the value "FALSE". This is also termed Double-Rail Encoding. In the initial state, also termed state of rest, the two signals w0 and w1 are "FALSE". Furthermore, both write signals w0 and w1 "TRUE" are excluded from this embodiment of four-phase handshake signalling. The acknowledge signal wa provides an acknowledgement that a change in either one of the two write signals w0 or w1 has been processed by the circuit 1. If a transmitter (not shown) has produced the write signal w0 "TRUE", the transmitter is informed by means of the "TRUE" state of the acknowledge signal wa that the change in the signal value of w0 has been processed by the circuit 1 and that the transmitter may render the write signal w0 "FALSE" again.

Figure 2:
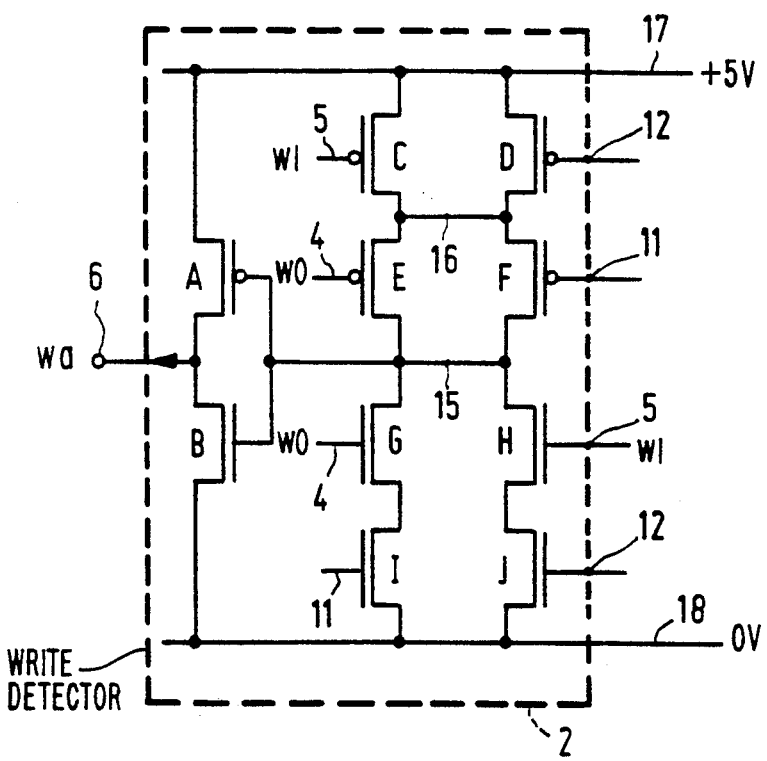
FIG. 2 shows a transistor circuit realization of the prior art write detector in FIG. 1.

FIG. 2 shows a transistor circuit embodiment of the write detector 2 shown in FIG. 1. The write detector 2 comprises a series connection of a p-MOS transistor A and an n-MOS transistor B connected between the voltage supply lines 17 and 18, two parallel-connected p-MOS transistors C and D between the voltage line 17 and a junction 16, two parallel-connected p-MOS transistors E and F between the junctions 16 and 15, the two parallel-connected series arrangements of n-MOS transistors, G and I parallel to H and J, between the junction 15 and voltage point 18. Respective voltages +5 V and 0 V are applied to the voltage supply lines 17 and 18. Such voltages represent the logic signals "1" and "0".

The p-MOS transistor A and n-MOS transistor B have control inputs which are connected to one another and which together form the junction 15. Such a series arrangement operates as an inverter, responsive to an applied logic signal at junction 15, to produce an inverted logic signal at acknowledge output 6. Furthermore, the control inputs of the p-MOS transistors C and D are respectively connected to write input 5 and complementary input 12. The control inputs of the p-MOS transistors E and F are respectively connected to write input 4 and complementary input 11. The write input 4 and complementary input 11 are likewise respectively connected to the control inputs of the two n-MOS transistors G and I. The control inputs of n-MOS transistors H and J are respectively connected to write input 5 and complementary input 12.

Figure 3:
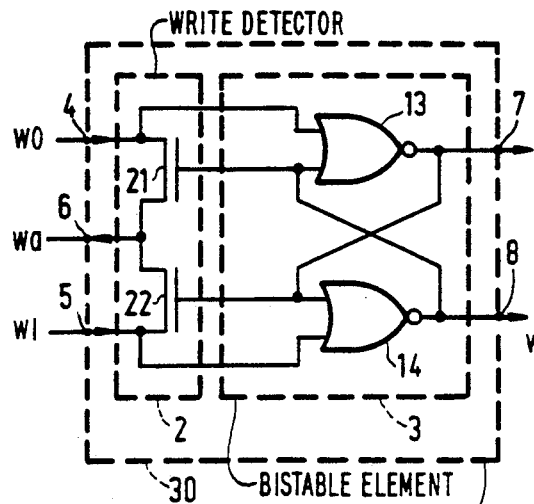
FIG. 3 shows a first embodiment of a write-acknowledge circuit according to the invention.

The prior art embodiment of a write detector 2, as represented in FIG. 2 comprises 10 transistors. FIG. 3 shows an embodiment of a write-acknowledge circuit 30 according to the invention in which the write detector 2 comprises no more than two transistors 21 and 22. In addition to the write detector 2 the write-acknowledge circuit 30 also includes a bistable element 3 the same as the bistable element shown in FIG. 1. The two transistors 21 and 22 are n-MOS transistors connected in series, the common connection thereof being point connected to write acknowledge output 6. The remaining two terminals of transistors 21 and 22 are respectively connected to the respective first inputs of NOR gates 13 and 14, and to the write inputs 4 and 5 respectively. The control inputs of transistors 21 and 22 are respectively connected to the second inputs of NOR gates 13 and 14 respectively. The control inputs of the transistors 21 and 22 construct the complementary inputs of the write detector 2.

The write-acknowledge circuit 30 according to the invention shown in FIG. 3 is also suitable for four-phase handshake signalling. Write detector 2 now includes no more than two transistors, which is possible because of the fact that with four-phase handshake signalling the write signals w0 and w1 on write inputs 4 and 5 in FIG. 3 never have the value "1" at the same time and the output signals on outputs 7 and 8 never have the value "1" at the same time.

Figure 4:
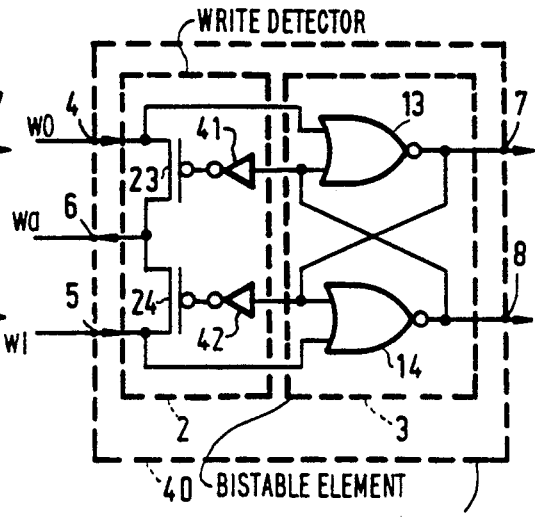
FIG. 4 shows a second embodiment of a write-acknowledge circuit according to the invention.

FIG. 4 shows an embodiment of another write-acknowledge circuit 40 which comprises a write detector 2 having two p-MOS transistors 23 and 24 and inverters 41 and 42, and a bistable element 3 having two NOR gates 13 and 14. The two p-MOS transistors 23 and 24 are connected in series, similar to the n-MOS transistors 21 and 22 in FIG. 3, the common connection point thereof being connected to acknowledge output 6 and the two remaining terminals thereof being respectively connected to write inputs 4 and 5. the bistable element 3 having two NOR gates 13 and 14 has the same structure as in FIG. 1. The outputs of NOR gates 13 and 14 are cross connected (or cross-coupled) to the control inputs of the p-MOS transistors 24 and 23 via the outputs 7 and 8 and inverters 42 and 41. The inputs of inverters 41 and 42 form the complementary inputs of write detector 2.

Figure 5:
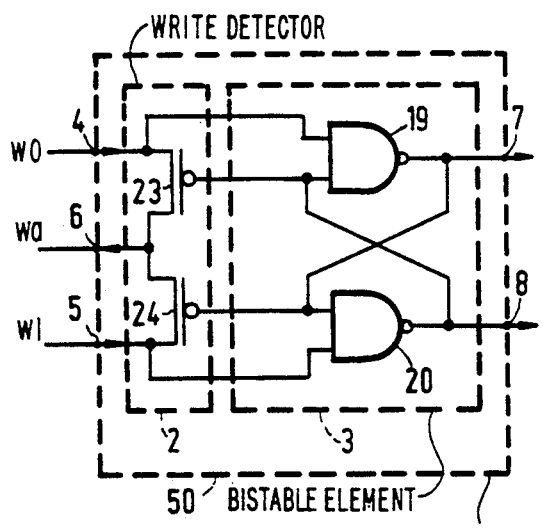
FIG. 5 shows a third embodiment of a write-acknowledge circuit according to the invention.
Figure 6:
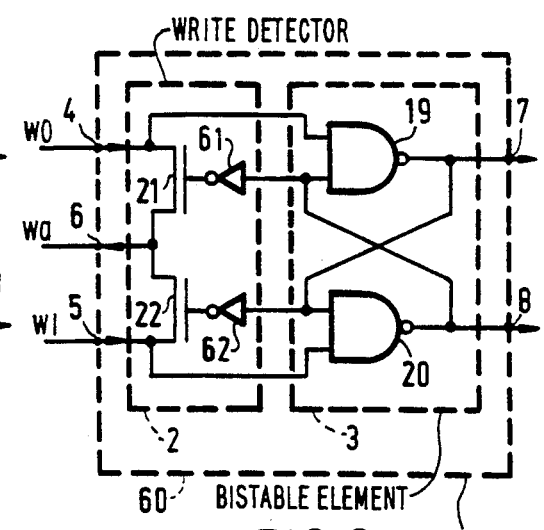
FIG. 6 shows a fourth embodiment of a write-acknowledge circuit according to the invention.

In the embodiments of write-acknowledge circuits 50 and 60 shown in FIGS. 5 and 6 two NAND gates 19 and 20 form the bistable element 3. In FIG. 5, the two p-MOS transistors 23 and 24 form the write detector 2, while the control inputs of transistors 23 and 24 are connected to the outputs 8 and 7 respectively. of NAND gates 19 and 20. Alternatively, in FIG. 6 two n-MOS transistors 21 and 22 are used whose control inputs are to form the write detector 2, respectively connected to the respective outputs 8 and 7 or gates 19 and 20, via inverters 61 and 62.

The embodiments of the write-acknowledge circuits 50 and 60 in FIGS. 5 and 6 are used in the situation in which with Double-Rail Encoding the state in which the two write signals w0 and w1 are simultaneously low is prohibited and in the state of rest the two write signals w0 and w1 are simultaneously high.

In FIGS. 4 and 6, the control inputs of the p-MOS transistors 23, 24 and of the n-MOS transistors 21, 22 respectively, may also be directly connected to outputs 7 and 8 of the respective NOR gates 13 and 14 rather than by the inverters 41, 42 or 61, 62 respectively, to the second input of either NOR gate. However, such an arrangement of the acknowledge circuit is disadvantageous in that when the signal value on one of the write inputs 4 or 5 changes, both transistors will be conductive during this transition period which causes undesired power dissipated and noise in the relevant input signals.

The two transistors in write detector 2 may alternatively be bipolar transistors the n-MOS transistors being replaced by npn transistors and the p-MOS transistors by pnp transistors.

We claim:
1. A write-acknowledge circuit comprising:
   a write detector having two write inputs, two complementary inputs and an acknowledge output; and
   a bistable element having two inputs respectively coupled tot he two write inputs of the write detector, and further having two outputs coupled crosswise to the two complementary inputs of the write detector for supplying two complementary signals thereto in response to a write signal on either of the two write inputs; characterized in that the write detector comprises:
   two switch elements connected in series, each switch element having a first terminal, a second terminal and a control input;
   the first terminals of the two switch elements constitute the two write inputs of the write detector, the second terminals of the two switch elements are connected together and constitute the acknowledge output of the write detector, and the control inputs of the two switch elements constitute the two complementary inputs of the write detector.

2. A write-acknowledge circuit as claimed in claim 1, characterized in that each switch element comprises an n-MOS transistor having a control input which constitutes the control input of that switch element, and in that the bistable element comprises two logic gates each having two inputs and a single output, one input of each logic gate being a respective input of the bistable element, the outputs of the two logic gates being the two outputs of the bistable element.

3. A write-acknowledge circuit as claimed in claim 1 characterized in that each switch element comprises an inverter and a p-MOS transistor having a control input which is coupled to an output of the inverter, the inverter having an input which constitutes the control input of that switch element; and in that the bistable element comprises two logic gates each having two inputs and a single output, one input of each logic gate being a respective input of the bistable element, the outputs of the two logic gates being the two outputs of the bistable element.

4. A write-acknowledge circuit as claimed in claim 1, characterized in that each switch element comprises a p-MOS transistor having a control input which constitutes the control input of that switch element; and in that the bistable element comprises two logic gates each having two inputs and a single output, one input of each logic gate being a respective input of the bistable element, the outputs of the two logic gates being the two outputs of the bistable element.

5. A write-acknowledge circuit as claimed in claim 1, characterized in that each switch element comprises an inverter and an n-MOS transistor having a control input which is coupled to an output of the inverter, the inverter having an input which constitutes the control input of that switch element; and in that the bistable element comprises two logic gates each having two inputs and a single output, one input of each logic gate being a respective input of the bistable element, the outputs of the two logic gates being the two outputs of the bistable element.

* * * * *